(12) United States Patent
Muth et al.

(10) Patent No.: US 11,588,663 B1
(45) Date of Patent: Feb. 21, 2023

(54) CONTROLLER AREA NETWORK TRANSCEIVER

(71) Applicant: NXP B.V., Eindhoven (NL)

(72) Inventors: Matthias Berthold Muth, Stelle (DE); Clemens Gerhardus Johannes de Haas, Ewijk (NL); Axel Engelhard, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/450,191

(22) Filed: Oct. 7, 2021

(51) Int. Cl.
*H04L 12/40* (2006.01)
*H03K 19/08* (2006.01)
*G06F 13/374* (2006.01)

(52) U.S. Cl.
CPC ...... *H04L 12/40013* (2013.01); *G06F 13/374* (2013.01); *H03K 19/0813* (2013.01); *H04L 12/40039* (2013.01); *H04L 2012/40215* (2013.01)

(58) Field of Classification Search
CPC ......... H04L 12/40013; H04L 12/40039; G06F 13/374; H03K 19/0813
See application file for complete search history.

(56) References Cited

U.S. PATENT DOCUMENTS

| | | | |
|---|---|---|---|
| 10,454,722 B2 * | 10/2019 | Soraku | H04B 1/10 |
| 11,038,714 B2 | 6/2021 | Muth | |
| 2005/0135331 A1 * | 6/2005 | Reindl | H04L 12/40032 370/351 |
| 2006/0158815 A1 * | 7/2006 | De Haas | H04L 25/03878 361/118 |
| 2009/0213915 A1 * | 8/2009 | Wagner | H04L 12/12 375/220 |
| 2009/0279635 A1 * | 11/2009 | Kinnaird | H04L 25/0274 375/287 |
| 2018/0196941 A1 * | 7/2018 | Ruvio | H04L 63/0227 |
| 2020/0382340 A1 * | 12/2020 | Muth | H04L 12/40013 |
| 2021/0006430 A1 * | 1/2021 | de Haas | H04L 12/40169 |
| 2021/0224079 A1 * | 7/2021 | Muth | H04B 1/38 |
| 2021/0226661 A1 | 7/2021 | De Haas | |

OTHER PUBLICATIONS

U.S. Appl. No. 17/447,749, filed Sep. 15, 2021.

* cited by examiner

*Primary Examiner* — Phong H Dang (57) ABSTRACT

A Controller Area Network (CAN) transceiver determines a voltage differential signal from analog signaling and provides a digital output signal at a receiver output to a CAN controller based on the voltage differential signal. The analog signaling received from the CAN bus can operate with a first voltage level scheme of a first CAN protocol and a second voltage level scheme for a second CAN protocol. A first comparator compares the voltage differential signal to a first threshold which is set to a value which differentiates between a logic low bit and logic high bit in accordance with the second CAN protocol. Filtering circuitry selectively filters an output of the first comparator based on detection of noise on the CAN bus to provide a first digital signal indicative of activity on the CAN bus according to the second CAN protocol.

20 Claims, 7 Drawing Sheets

CONTROLLER AREA NETWORK TRANSCEIVER

FIELD

The present disclosure relates to controller area network (CAN) transceiver, a CAN node comprising a CAN controller in combination with said CAN transceiver and a method of operating a CAN transceiver.

BACKGROUND

In-vehicle network (IVN) buses, such as CAN (Controller Area Network), CAN FD (CAN with Flexible Data-Rate), LIN (Local Interconnect Network), FlexRay, Ethernet based network buses, and other types, can be used for communications within vehicles. For example, controller area network (CAN) bus is a message-based communications bus protocol that is often used within automobiles. It will be appreciated that CAN networks also have application outside of the field of automobiles. A CAN bus network may include multiple bus devices, so called nodes or electronic control units (ECUs), such as an engine control module (ECM), a power train control module (PCM), airbags, antilock brakes, cruise control, electric power steering, audio systems, windows, doors, mirror adjustment, battery and recharging systems for hybrid/electric cars, and many more. The CAN bus protocol is used to enable communications between the various bus devices. The data link layer of the CAN protocol is standardized as International Standards Organization (ISO) 11898-1:2003. CAN Flexible Data-Rate or "CAN FD," which is an extension of the standardized CAN data link layer protocol and is meanwhile integrated into the ISO11898-1:2015 standard, can provide higher data rates. But the standardized CAN data link layer protocol is still in further process of being extended to provide even higher data rates. A further extension, referred to as CAN XL, with a new level scheme allowing even higher data rates is in the definition phase discussed under CiA610 (CAN in Automation) and is moving towards standardization in the form of either a further update of the existing ISO11898 standards or a new standard. However, it is of interest to allow backwards compatibility between all the CAN flavours, for example, CAN XL with CAN FD.

BRIEF DESCRIPTION OF THE DRAWINGS

One or more embodiments will now be described by way of example only with reference to the accompanying drawings in which.

DETAILED DESCRIPTION

Embodiments of CAN XL transceivers disclosed herein are designed to be backward compatible with devices that use the CAN FD protocol. The backward compatibility is achieved through a control bit within the CAN FD protocol bit stream that forces existing CAN FD controllers into a protocol exception state, whenever a CAN XL frame is detected on the bus lines. The voltage level schemes for CAN XL and CAN FD comprise the voltages used for signalling on the wires of the CAN bus. The modification of the voltage level scheme used by CAN FD compared to CAN XL may be useful for achieving higher bus speeds with CAN XL. In one or more examples, the transceiver described herein may make it possible to run both protocols, CAN FD and CAN XL, interleaved on the same bus wires despite the use of a different voltage level schemes.

If a sending node unexpectedly stops sending data within a data phase of a frame, for example, due to an error or a reset, the sender switches back to the Arbitration phase level mode and the bus will immediately show 0V differential. A receiving node still in the Data Phase level mode uses a receiver threshold of 0V differential and with that, such receiver is not able to detect that the sender has stopped sending. Any small noise or alien cross talk on the bus lines around 0V differential may look like traffic coming from the formerly sending node. Upon reaching a receiver protocol violation, the receiving nodes would discover their mistake and switch back as well to the Arbitration level mode with a potentially huge delay. The delay can cause the receiving nodes to be "out of sync" relative to the previous sender. Embodiments of receivers disclosed herein help ensure the receiving nodes discover that a sender has stopped sending as early as possible. Embodiments of CAN XL transceivers disclosed herein solve the problem of detecting when a sending node has stopped transmitting by evaluating a comparator output with a negative threshold, which is used to qualify the output signal of the normal 0V receiver output. Noise or cross talk can be quickly discovered and sorted out. Consequently, the connected CAN XL protocol controller of all receiving nodes can discover that the sending node has stopped communication and switches back to the Arbitration Level Mode in time to stay in sync with the formerly sending node.

Figure 1:
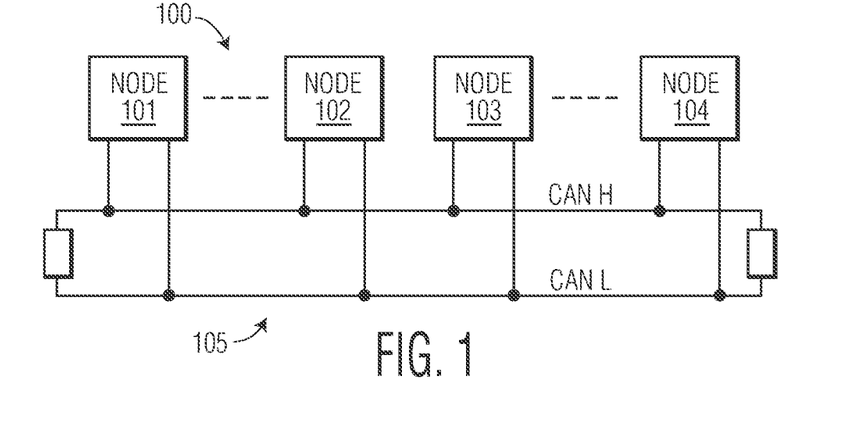
FIG. 1 shows an example embodiment of a plurality of CAN nodes connected to a common CAN bus.

As an example of a CAN network, FIG. 1 shows a CAN bus system 100 with a plurality of nodes or ECUs (Electronic Control Units) 101-104 connected to the same CAN bus wires 105 comprising a first CANH wire and a second CANL simultaneously. The nodes 101 and 102 comprise conventional CAN FD nodes that implement the CAN FD protocol. The nodes 103 and 104 comprise nodes that implement an extended version of the CAN protocol, such as the proposed CAN XL protocol. The CAN XL protocol is not known to the nodes 101, 102 that implement the CAN FD protocol.

Figure 2:
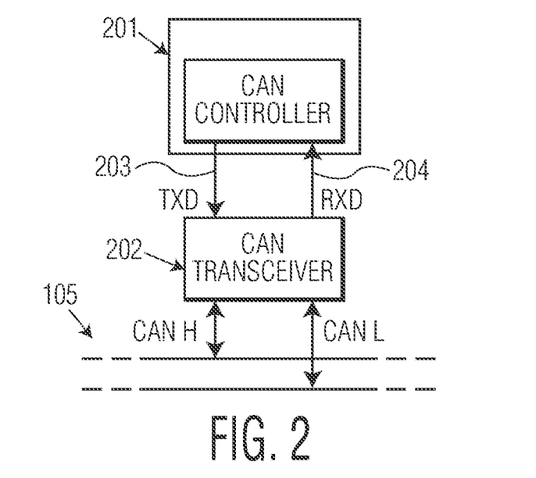
FIG. 2 shows an example CAN node comprising a CAN controller coupled with a CAN transceiver, the CAN transceiver providing the coupling to the CAN bus.

FIG. 2 shows an example of one of the nodes 101-104 in more detail. A node mainly comprises a CAN controller 201, such as a microcontroller, that implements the CAN FD or CAN XL protocol such as by using an embedded CAN FD or CAN XL protocol controller. The controller 201 is connected to the CAN bus 105 by a CAN transceiver 202. The CAN controller 201 is connected to the CAN transceiver 202 through two interface connections called TXD (Transmit Data) pin 203 and RXD (Receive Data) pin 204. The controller may therefore have a transmit output that couples with a transmit input of the transceiver. Likewise, the transceiver may have a receive output that couples with a receive input of the controller. The transceiver 202 is used to convert transmit data comprising a digital bit stream on TXD pin 203 into analogue signalling on the bus wires 105. The transceiver 202 may also be used to convert analogue signalling from the bus 105 into receive data comprising a digital output signal or bit stream that is provided to the RXD pin 204.

The introduction of a new CAN protocol variant can be an issue if such introduction is not backwards compatible/interoperable. Both CAN transceivers and CAN controllers at each node in a network may experience data inaccuracies when transitioning from one CAN protocol variant to the next. Therefore, it may be important to ensure compatibility and, optionally, interoperability between nodes using CAN FD and CAN XL.

As mentioned, the CAN FD protocol has a function called "protocol exception state", which places a CAN FD controller in a waiting loop until the bus 105 becomes free again. Within this state a CAN FD controller tolerates bus signalling that is non-compliant with the CAN FD protocol, without creating any errors. To stay within the protocol exception state, there must be dominant signals (i.e. a logic 0 signal)/dominant level changes on the receive input from the receive connection 204 towards the CAN FD controller in order to signal to the CAN FD controller that there is still activity on the bus. To leave the protocol exception state, the CAN FD controller looks for a period of recessive signals (i.e., a contiguous logic 1 signal over several bits) on the RXD pin 204 whereupon the bus 105 is regarded to be free again and the "not known" protocol has finished.

CAN XL makes use of the Protocol Exception State of CAN FD and is intended to keep the CAN FD controllers in the exception state until the CAN XL frame is finished. Therefore, it is assumed, that the CAN XL protocol creates the required dominant signal or dominant signal changes based on the CAN XL traffic at the RXD pin 204 so that the CAN FD controllers remain in the protocol exception state until the CAN XL traffic is complete.

The proposed CAN XL physical layer however specifies modifications in the voltage level scheme of the signalling of bits on the bus 105 wires in order to provide the desired bus speed performance. A result of this voltage level scheme is that there are potentially no dominant signal edges on the RXD pin 204 towards any CAN FD controllers that may be part of the network 100 because voltage tolerances of the voltage levels used on the bus 105 may result in dominant signalling not being detected by the CAN FD compliant CAN transceivers. In essence it may be that the CAN XL signalling uses voltage levels that are so low in amplitude that the CAN receiver with the classical receiver thresholds (as used in the CAN FD module) does not recognize any bus 105 activity and the RXD pin 204 provided to the CAN FD controller may appear to be continually recessive. As a consequence, the CAN FD controller would leave their protocol exception state too early and create errors, which may interfere with traffic on the bus 105.

A similar problem occurs, if a node is powered-up the first time, while other nodes in the system are already communicating with CAN XL protocol and levels. A node, which is powered up may start in the protocol exception state by default and then wait for the expiration of this exception state. It may be important that a node reliably recognizes the communication in CAN XL level scheme in order to stay in this exception state, until the bus is free again.

One or more examples of the present disclosure may be configured to reliably keep the CAN FD nodes in their protocol exception state during signalling on the bus 105 defined in the proposed CAN XL physical layer. In one or more examples, nodes having CAN controllers that implement CAN FD and CAN XL protocol can be mixed on one and the same bus 105 without any restrictions. This may enable interleaved CAN FD and CAN XL communication on the same medium and may allow for integration of nodes into the network 100 after they are powered-up.

For bus speed reasons the CAN XL physical layer switches the output and input behaviour, i.e. the voltage level scheme and, optionally, the signalling rate, depending on the phase of the protocol. At the beginning of a CAN XL frame, the CAN FD or ISO 11898-2:2016 level scheme is used, which is also used for CAN FD nodes. This guarantees the interoperability/backwards compatibility of CAN FD with CAN XL at the beginning of the frames. This voltage level scheme is used for determining the node 101-104 that gains bus access through the known CAN Arbitration method.

After passing the decision point, the protocol being used (CAN FD or CAN XL) is signalled and the Physical Layer of CAN XL is changed to the CAN XL voltage level scheme or remains in the CAN FD voltage level scheme. In the case a CAN XL node 103, 104 has won the bus access, the CAN XL voltage level scheme may be used to provide stronger output drive with different output and input levels. This may be required to drive the bus with maximum physical speed. The old, CAN FD voltage level scheme was not optimized for speed and as such may not be suitable for very high bus speeds, which is the main desired feature of CAN XL.

If we consider a CAN XL compliant controller coupled with a CAN transceiver in accordance with an embodiment herein, the new CAN XL Physical Layer may be configured to switch between the two voltage level schemes through a control mechanism between the CAN XL Controller (or protocol controller thereof) and the CAN Transceiver. The transceiver is usually a very simple device not knowing the protocol to be transported. So, the CAN XL controller may be configured to provide this switching information. For the present disclosure it is not of relevance how this control is done. It can be easily understood, that an old CAN FD controller cannot deliver this switching signal, because it was developed at a time when CAN XL was not known. As such, a module with a CAN FD controller in combination with a CAN transceiver in accordance with an embodiment herein cannot be switched to the CAN XL voltage level scheme while other nodes are using the CAN XL protocol.

One or more examples described herein propose to have a detection mechanism inside the CAN Transceiver, which may autonomously execute the switching between the two voltage level schemes based on observation of the voltage levels on the bus. If there is CAN XL traffic on the bus lines, the exemplary CAN transceiver 202 may be configured to forward an according level to the RXD pin 204 of the connected CAN FD controller 201 keeping it reliably in the protocol exception state until the CAN XL frame ends.

In one or more examples, the CAN transceiver described herein may be used in all nodes regardless of the CAN controller (or protocol controller thereof) to which it is coupled. Accordingly, the CAN transceiver described herein in the examples that follow may be coupled with a CAN FD compliant controller (e.g. one that is not capable of communication under the CAN XL protocol) or a CAN XL compliant controller (e.g. one that is capable of communication under CAN XL and CAN FD for at least the arbitration phase). If this is the case, both protocols can be used simultaneously on the same bus 105 with interleaved message formats. "Old" nodes with CAN FD controllers may only need to be upgraded with a new CAN transceiver. This is a minor change and can be done when the CAN transceiver as described herein is available. It may take a longer time until all controllers 201 with the CAN protocol are upgraded to CAN XL controllers.

The CAN XL protocol is defined to be a superset of CAN FD and the classical CAN protocol. As such, a CAN XL module may as well use the CAN FD protocol or even the classical CAN protocol depending on configuration/programming of the CAN XL controller.

CAN FD and CAN XL both use the identical bus access mechanism and bus voltage level scheme through the so-called bit wise arbitration as defined for CAN in ISO11898. As such, both CAN variants are interoperable and backwards compatible. As long as the CAN FD node is winning the bus access through a higher priority in the identifier, the CAN FD protocol continues through the rest of the frame with the known bus voltage level scheme as used in CAN and CAN FD. A CAN XL controller is capable per definition of the CAN XL Standard to understand the CAN FD signalling.

Figure 3:
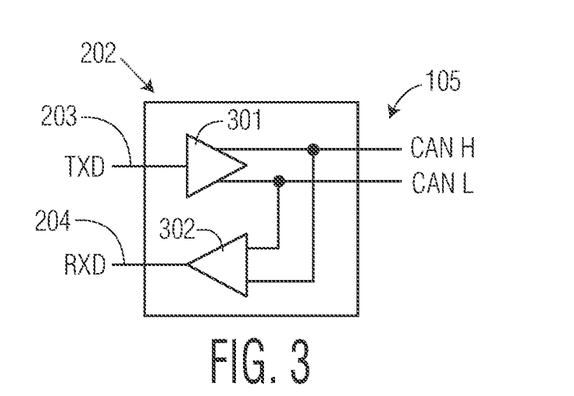
FIG. 3 shows an example CAN transceiver having a transmitter arrangement and a receiver arrangement.

FIG. 3 shows a general arrangement of a CAN transceiver 202 including the transmit input for coupling to the TXD pin 203 and the receive output for coupling to the RXD pin 204. The transceiver 202 comprises a transmitter arrangement 301 for receiving digital transmit data from the transmit input 203 and for coupling to the bus 105 to provide differential signalling based on the transmit data to the two wires of the bus 105. The transceiver 202 comprises a receiver arrangement 302 for receiving signalling from the bus 105, and to provide a digital output signal to the receive output based on a differential signal received from the bus 105.

Figure 4:
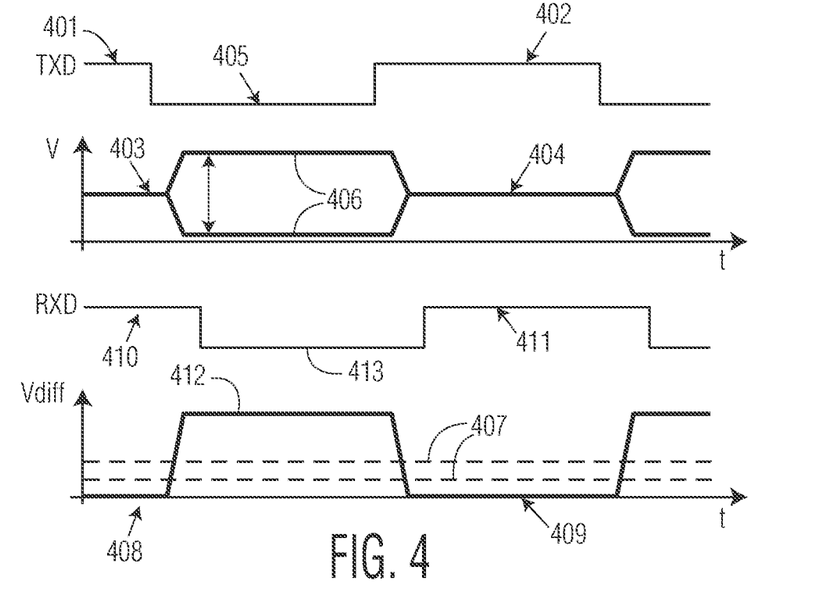
FIG. 4 shows an example timing diagram illustrating a transmit signal and the corresponding signalling applied to the CAN bus, and a received digital output signal derived from a differential signal obtained from signalling on the CAN bus, according to the CAN or CAN FD protocol.

A transceiver according to the state of the art for CAN systems may use a voltage level scheme as defined in the ISO 11898-2:2016 standard. FIG. 4 illustrates an example timing diagram showing such a voltage level scheme. Logic high bits, also known as recessive bits, in the transmit data at 401, 402 are represented with 0V differential at 403, 404, while logic low bits, also known as dominant bits, at 405 are represented with a positive differential voltage between +1.5V to +3V, shown by the different voltage levels at the CANH wire and CANL wire of the bus at 406. As such the transmitter arrangement 301 is converting a logical "1" (high level, also known as recessive) to a 0V differential output voltage and a logical "0" (low level, also known as dominant) into a positive differential voltage between +1.5V up to +3V.

The receiver arrangement 302 connected to the RXD pin 204 is converting the differential voltage back into logical levels. Again, in accordance with the ISO 11898-2:2016 standard the receiver arrangement 302 switches with a threshold voltage or threshold voltage range 407 of +0.5V up to +0.9V differential between the logical states. In case the differential bus voltage (Vdiff) is below +0.5V as at 408 and 409, the receive arrangement outputs "1" (high level, also known as recessive) as shown at 410 and 411. If the bus voltage is higher than +0.9V as at 412, the receive arrangement outputs "0" (low level, also known as dominant), as at 413.

One of the aims for CAN XL is that the communication speed shall be improved towards the maximum that is physically possible. The voltage level scheme as defined in the ISO11898-2:2016 is not optimized for that purpose due to several reasons.

First, the arbitration mechanism needs to make sure that the bus becomes relatively high-ohmic (this is, why that state is called "recessive") for the logical state "1" (high). This high ohmic state can be overridden by another sender with a low-ohmic "0" (this is, why it is called "dominant"). Second, this same mechanism is used through all the CAN FD frames to signal a detected error on the bus lines. Any node may override a sender at any time during the recessive bit phases and with that, stop a transmission on the fly.

"High ohmic" driven bits are rather slow and have other drawbacks in practice. Long physical bus cables with multiple branches can create a lot of reflections and may corrupt the high-ohmic bits.

The CAN XL voltage level scheme may be more optimized for maximum signal performance on the bus 105. Since the Arbitration phase used for determining bus access stays the same in CAN XL (for backwards compatibility), a CAN XL Transceiver may use the new voltage level scheme only after the Arbitration phase is complete and the CAN XL controller has won access to the bus. At that moment, the CAN XL Transceiver may switch to the new voltage level scheme and boost the speed on the bus 105. Intentionally, the CAN XL protocol may not allow any other node to override data bits. The high ohmic output behaviour could be avoided and all bit levels driven with more optimum strength.

Figure 5:
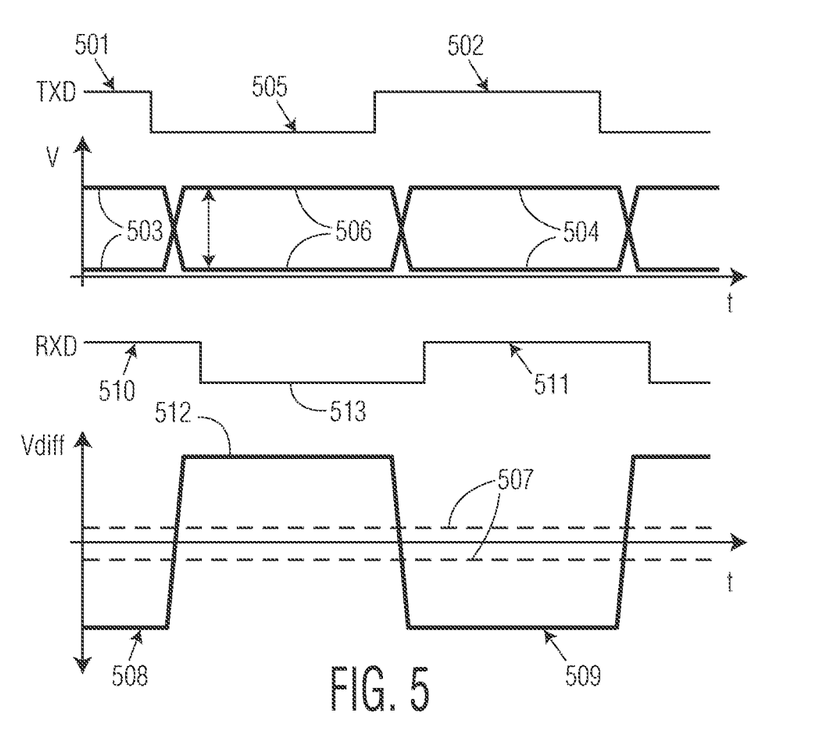
FIG. 5 shows an example timing diagram illustrating a transmit signal and the corresponding signalling applied to the CAN bus, and a received digital output signal derived from a differential signal obtained from signalling on the CAN bus, according to the proposed CAN XL protocol.

FIG. 5 shows an example timing diagram showing a proposed CAN XL voltage level scheme. In the voltage level scheme of CAN FD, bits are described as recessive or dominant. However, in the proposed scheme there are no recessive bits. Logic high bits in the transmit data at 501, 502 are represented with a negative differential signal (i.e. equal to CANH-CANL), shown by the different voltage levels at the CANH wire and CANL wire of the bus at 503, 504. Logic low bits at 505 are represented with a positive differential voltage, shown by the different voltage levels at the CANH wire and CANL wire of the bus at 506. As such the transmitter arrangement 301 is converting a logical "1" (high level) to a negative differential output voltage between −0.6V and −1V and a logical "0" (low level) into a positive differential voltage between +0.6V and +1V.

The receiver arrangement 302 connected to the RXD pin 204 converts the differential voltage back into a digital output signal with logical levels. The receiver arrangement switches with a threshold voltage or threshold voltage range 507 of −0.1V to +0.1V differential between the logical states. In case the differential bus voltage (Vdiff) is below 0.1V as at 508 and 509, the receive arrangement outputs "1"

(high level) as shown at 510 and 511. If the bus voltage is higher than +0.1V as at 512, the receive arrangement outputs "0" (low level), as at 513.

For CAN XL Transceivers a mechanism is defined which triggers the switching between the voltage level schemes shown in FIGS. 4 and 5. This mechanism changes the transmitter behavior from the known ISO11898-2:2016 level scheme towards the new proposed one for CAN XL and vice versa. The same mechanism may be used for switching the receiver thresholds between the voltage level schemes.

Figure 6:
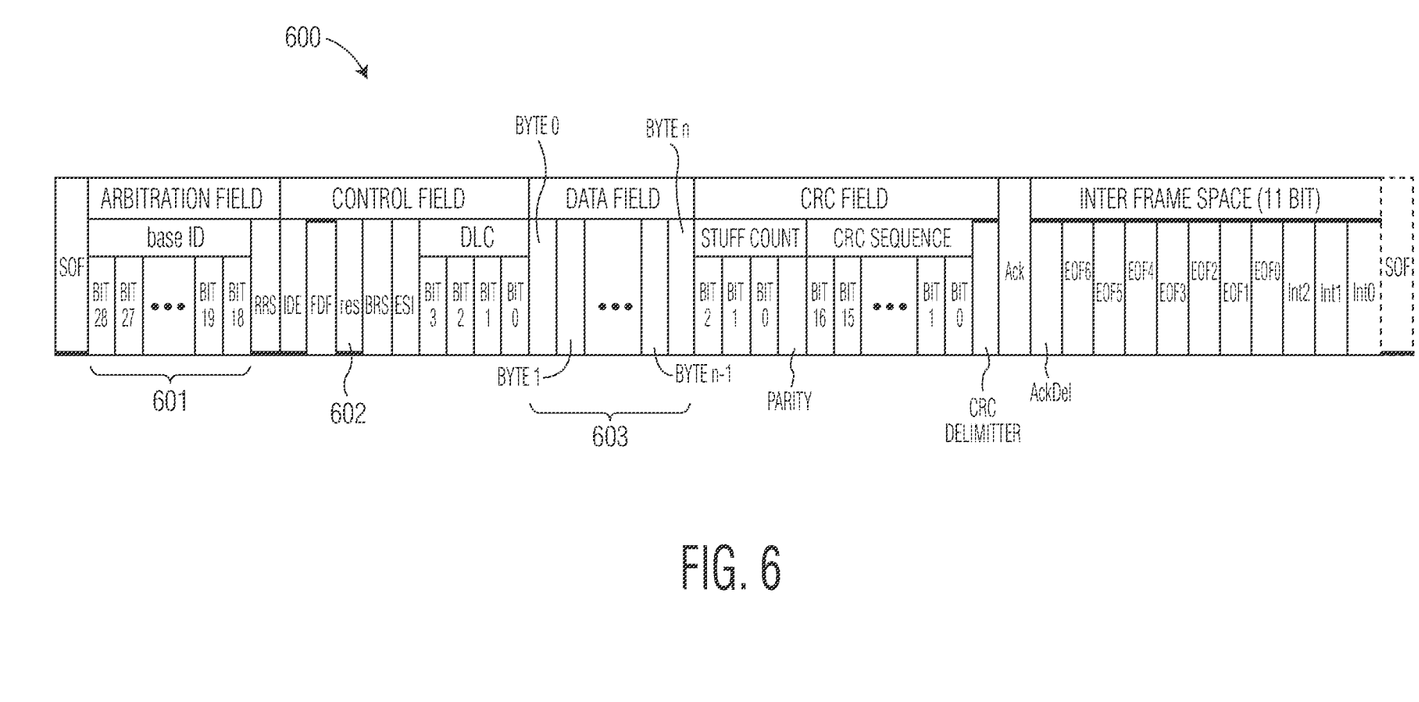
FIG. 6 shows an example CAN frame format illustrating a bit position in which the upcoming presence of non-CAN or non-CAN FD signalling, such as CAN XL, on the CAN bus can be indicated.

FIG. 6 illustrates an example CAN FD frame format 600 (here the CAN FD Base Frame Format with 11-bit Identifier). Following a series of bits 601 used for the arbitration process there comprises a reserved bit 602 for signalling the use of the protocol exception state for any CAN FD controller on the network 100 or, for nodes that support CAN XL, the reserved bit may signal the upcoming use of the CAN XL protocol. The data field 603 may therefore contain CAN FD compliant signalling if the bit 602 is dominant and the data field 603 may contain CAN XL compliant signalling if the bit 602 is recessive. Thus, the bit 602 may be considered to be where the transition from the CAN FD protocol towards the CAN XL protocol takes place. If this reserved bit is dominant (logic 0) on the bus lines, this is a CAN FD frame and all following bits follow the CAN FD protocol rules as shown in FIG. 6. If this reserved bit is recessive on the bus (logic 1), all following bits may follow the CAN XL protocol rules (not shown in FIG. 6).

Figure 7:
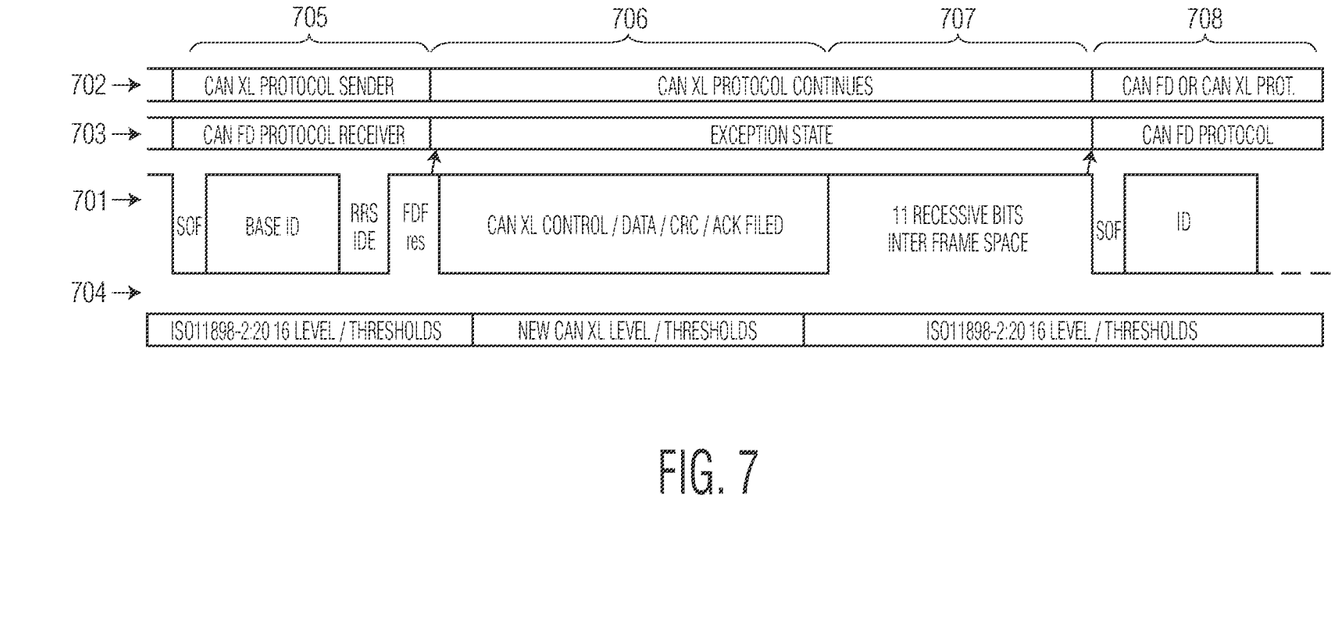
FIG. 7 shows an example timing diagram in which non-CAN or non-CAN FD signalling, such as CAN XL signalling, is provided while a CAN FD node is in a protocol exception state.

FIG. 7 shows an example timing diagram illustrating the bits received 701 on the bus 105, the state of a CAN XL node at 702 in response to said bits, the state of a CAN FD node at 703 in response to said bits and the voltage level scheme used in the bus at 704. The period 705 comprises the arbitration phase in which the CAN XL node, in this example, wins arbitration. The reserved bit 602 is placed in the logic 1 state by the winning node and this is transmitted on the bus. Accordingly, the CAN XL node is shown as continuing the CAN XL protocol and, during period 706, the CAN FD node receives the recessive logic 1 reserved bit 602 and places itself in the protocol exception state. Once a CAN FD controller discovers this reserved bit to be recessive, it enters the "Protocol Exception State" ignoring all traffic on the bus from now on. The CAN FD controller will stay in this state as long as it does not see a period of predetermined length on the bus and respectively at the receive input from the RXD pin 204 with a contiguous recessive state.

So, normally, as long as the CAN XL node is still sending signalling to the bus, the CAN FD node(s) remain in the Protocol Exception State because the CAN FD nodes see the bus activity includes dominant signalling caused by the CAN XL signalling on the bus 105.

Similar to all CAN protocol flavours like CAN FD or classical CAN, the proposed CAN XL frames also end with 11 consecutive bit times in a recessive logic 1 state until a next frame may start. For these 11 consecutive recessive bit times, there are no bit transitions anymore on the bus and with that on the RXD pin 204 of the CAN FD controllers in the CAN FD modules. These 11 recessive bits defined in CAN XL also serve to provide the predetermined time of contiguous recessive signalling required to signal that the CAN FD controller(s) can leave the Protocol Exception State. So, after 11 bit times of silence in recessive state, all nodes are active again and a new negotiation period on the bus 105 may start through the next Arbitration Phase 708. Considering the voltage level scheme 704, the CAN FD voltage level scheme is used during the arbitration phase 705, the predetermined time of recessive signalling to leave the protocol exception state 707 and the next arbitration phase 708. During the data phase 706 in which a CAN XL controller has won arbitration, the CAN XL voltage level scheme is used. The transition back to ISO11898-2:2016 level scheme happens at some non-relevant bit position at the end of the CAN XL frame but before the predetermined time period, also known as the Inter Frame Space 707, starts.

Thus, provided that dominant signalling is visible to the CAN FD controllers during the data phase 706, it can be understood that it is possible to mix CAN FD with CAN XL nodes in one and the same bus system. This mechanism only works if the CAN FD node in Protocol Except State can observe the bus activity by the RXD pin 204 while the CAN XL node is transmitting bits on the bus.

A problem can arise when an unexpected stop of the sender's transmission during CAN XL Data Level Mode results in a physical bus level of 0V differential which cannot be easily detected by the receiving nodes still being in CAN XL Data Level Mode and making use of a receiver threshold of 0V differential. Even a few millivolts of noise or alien cross talk from other wires in the vicinity may trigger the 0V receiver threshold resulting in a permanent toggle of the receiver's output. The connected CAN XL protocol controller would assume the "toggling" is still CAN XL data traffic and with that, continue to receive a "virtual frame" although the original sending node has stopped talking. As a consequence, the sending node sees an "IDLE" bus while the receiving nodes are still assuming they are receiving data from the original sender. In such a situation, the sender and all receiver nodes may be out of synchronization and the sending node may start much earlier with a next transmission while all receivers are not yet ready to receive anything. Accordingly, these receivers will not be able to receive the next frame of the sender.

This problem caused by an unexpected stop of the sender's transmission being masked by noise or cross talk on the bus may be mitigated by evaluating a comparator output with a negative threshold, which is used to qualify the output signal of the normal 0V receiver output. With that, noise or cross talk can be quickly discovered and sorted out. Consequently, the connected CAN XL protocol controller of all receiving nodes can discover that the sending node has stopped communication and switch back to the Arbitration Level Mode in time staying in sync with the formerly sending node.

Figure 8:
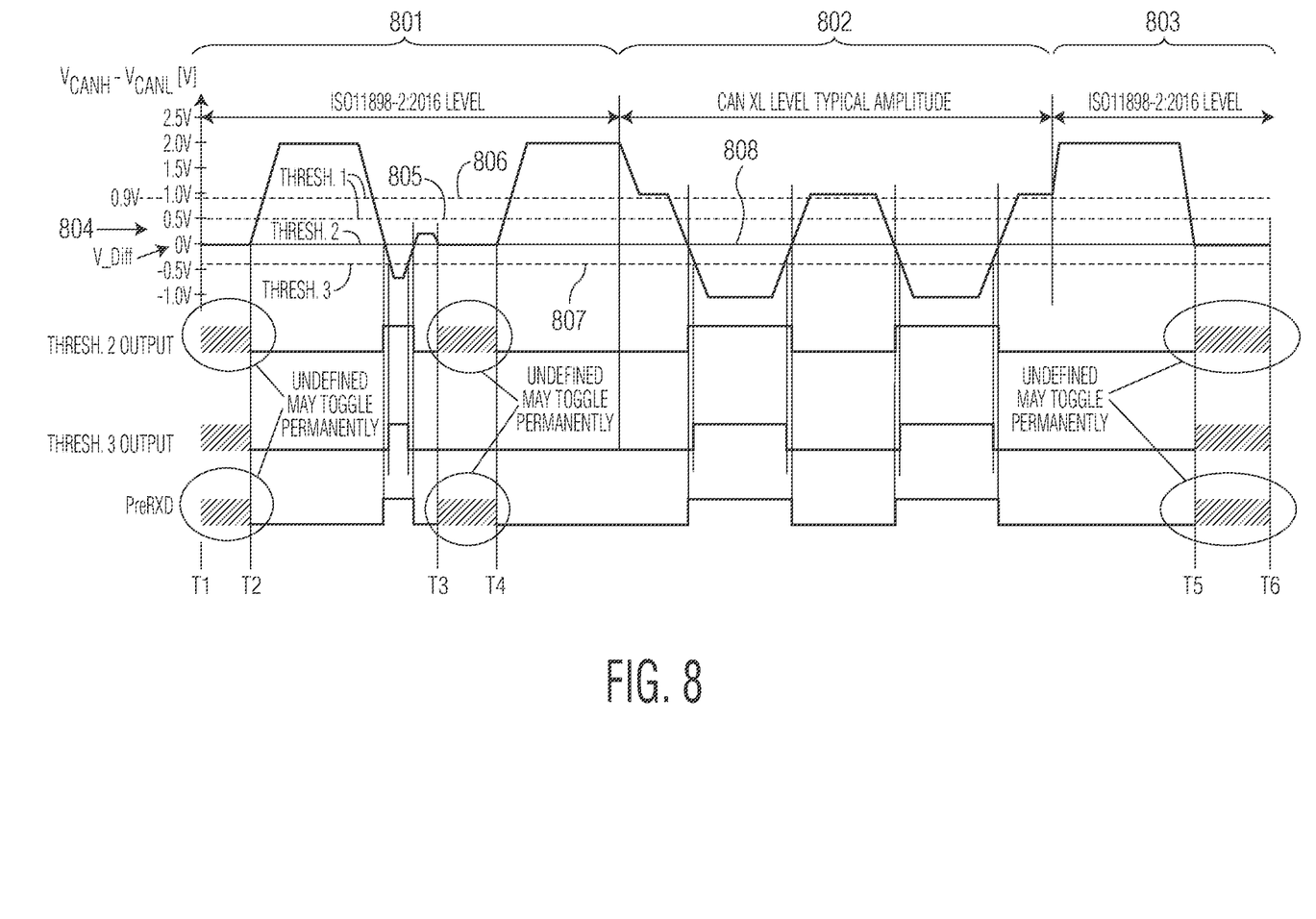
FIG. 8 shows a first example of a differential signal obtained from CAN bus signalling according to CAN FD which switches to CAN XL and back to CAN FD.

FIG. 8 shows an example of a differential signal obtained from CAN bus signalling according to CAN FD during time period 801, switching to CAN XL during time period 802, and back to CAN FD during time period 803. A problem can arise if a transmitting CAN XL node unexpectedly switches to arbitration level mode behaviour in accordance with ISO11898-2:2016 levels while the CAN XL receiving nodes are in data level mode operating with the differential voltage signal VDIFF 804 at threshold 2 level 808. Examples of time periods when differential voltage VDIFF 804 is at threshold 2 (nominally 0V) with receivers operating in data mode are shown at time T1 to time T2, time T3 to time T4, and time T5 to time T6. Whenever the ISO11898-2:2016 signal falls to the recessive state (VDIFF=0V) differential voltage VDIFF 804 may toggle with any random noise frequency or pattern. The resulting signal would only depend on the noise level on the CAN bus wires. The undefined toggling leaves any receiving node in data level mode assuming, that there is activity/traffic from a sending node.

Figure 9:
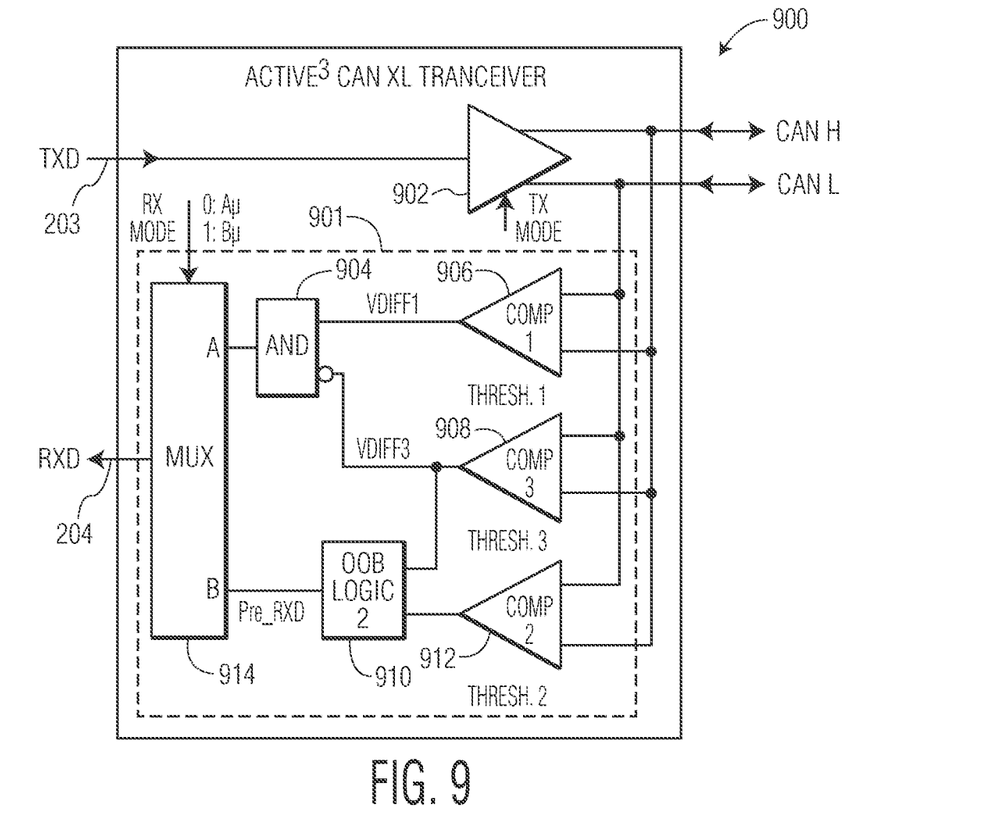
FIG. 9 shows an example of a CAN XL transceiver configured with the out-of-bounds logic.

Referring to FIGS. 8 and 9, FIG. 9 shows an example embodiment of an active CAN XL transceiver 900 that avoids allowing receiving nodes to continue operating in data level mode after a transmitting node stops sending data unexpectedly. CAN XL transceiver 900 can use threshold signals 2 and 3 (FIG. 8) to distinguish "noise" from real communication during the data level mode operation of a receiver. Out of bounds (OOB) logic 910, also referred to as filtering logic, may be added between the outputs of comparators 908 and 912, and multiplexer 914, so that only signals with larger negative voltage amplitude than expected levels of noise pass through OOB logic 910.

Active CAN XL transceiver 900 includes transmitter 902, and receiver arrangement 901 that includes comparators 906, 908, 912, OOB logic 910, AND logic gate 904, and multiplexer 914. The term "active CAN XL transceiver" can refer to a transceiver that operates with the CAN XL protocol and voltage thresholds, and is backward compatible with the CAN FD protocol. Active CAN XL transceiver 900 is able to decipher data in the CAN XL protocol as well as the CAN FD protocol.

In one or more examples, transceiver 900 further comprises a transmit pin 203 for coupling to CAN controller 201 (FIG. 2) and to receive a single-ended transmit signal therefrom. Transmitter 902 is coupled to the transmit input 203 to receive the transmit signal and, based on the input transmit signal, outputs differential analog signals CANH and CANL that are coupled to the to the CAN bus 105 (FIG. 1).

Receiver arrangement 901 can be configured to provide a digital output signal to the RXD pin 204 based on the differential signals (CANH/CANL). Comparator 906 may be configured to determine a digital output signal using the CAN FD voltage level scheme with a first threshold voltage of +0.5V to +0.9V. Comparator 906 may be configured to determine a digital output signal using the CAN FD voltage level scheme with a threshold 1 voltage of +0.5V to +0.9V. Comparator 908 may be configured to determine a digital output signal using the CAN XL voltage level scheme with a threshold 3 voltage of −0.25V to −0.45V. Comparator 912 may be configured to determine a digital output signal using the CAN XL voltage level scheme with a threshold 2 voltage level related to a FAST mode of the CAN XL standard (CiA610-3), which is shown as threshold voltage of −0.1V to +0.1V. The term "FAST mode" refers to the relatively higher data rates that are achieved with the CAN XL protocol compared to operation using the CAN FD protocol, which is referred to as a "SLOW mode."

Comparator 906 includes a first input coupled to the CANL signal and a second input coupled to the CANH signal. An output of comparator 906 is a digital signal that indicates whether differential signals CANL and CANH are between a first threshold, for example, between 0.5V and 0.9V, or other selected voltages. The output of comparator 906 is provided as an input to AND logic gate 904. Comparator 908 includes a first input coupled to the CANL signal and a second input coupled to the CANH signal. An output of comparator 908 is a digital signal that indicates whether differential signals CANL and CANH are below a third threshold, for example, below −0.4V or other selected voltage. The output of comparator 908 is provided to an inverting input of AND gate 904 and to an input to OOB logic 910. Comparator 912 includes a first input coupled to the CANL signal and a second input coupled to the CANH signal. An output of comparator 912 is a digital signal that indicates whether differential signals CANL and CANH are below a second threshold 808 (FIG. 8), for example, below −0.1V or other selected voltage. The output of comparator 912 is provided to an input of OOB logic 910.

Multiplexer 914 includes a first input (A) coupled to the output of AND logic gate 904, a second input (B) coupled to the output of OOB logic 910, and an output coupled to the RXD pin 204. During a SLOW mode (Rx Mode logic "0") of operation corresponding to CAN FD operation, the RXD pin 204 is coupled to the output of AND logic gate 904 through multiplexer 914. During the FAST mode (Rx Mode logic "1") of operation corresponding to CAN XL data phase operation, the RXD pin 204 is coupled to the output of OOB logic 910 through multiplexer 914.

Figure 10:
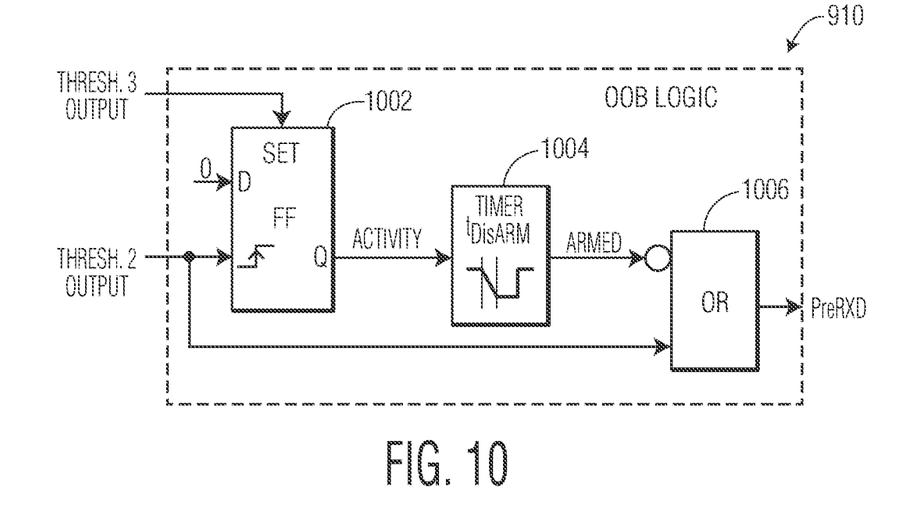
FIG. 10 shows an example of out-of-bounds (OOB) logic that can be used in the CAN transceiver of FIG. 9.

Referring to FIGS. 9 and 10, FIG. 10 shows an example of out-of-bounds (OOB) logic 910 that can be used in CAN transceiver 900 of FIG. 9. OOB logic 910 includes flip flop circuit 1002, disarm timer 1004, and OR gate 1006. D flip flop circuit 1002 includes a data input that receives a constant "0" or LOW value, a clock input coupled to the output of threshold 2 comparator 912, and a set input coupled to the output of threshold 3 comparator 908. Flip flop circuit 1002 may be used to detect the rising edge of the Threshold 2 comparator 912 and load a "0" from the data input towards the output Q. An ACTIVITY signal is shown at the output Q of flip flop circuit 1002. Any static HIGH signal coming from Threshold 3 comparator 908 sets the ACTIVITY signal HIGH again asynchronously. The output of flip flop circuit 1002 is coupled to an input of disarm timer 1004, which can filter out short activity signals for a time period equal to TDISARM. If the ACTIVITY signal is LOW for a longer time than TDISARM, an ARMED signal output by timer 1004 goes LOW. When the ACTIVITY signal goes HIGH again, the ARMED signal goes HIGH as well without relevant delay.

The ARMED signal is coupled to an inverting input of OR gate 1006. A second input of OR gate is coupled to the output of threshold 2 comparator 912. When the ARMED signal is LOW, the output of OR gate 1006 is HIGH. The output of OR gate 1006, shown as PRE_RXD signal, is the output of OOB logic 910.

The minimum value for TDISARM may depend on the delay between threshold 2 comparator 912 and threshold 3 comparator 908 and is depicted by the slope time of the bus signal in timer 1004 of FIG. 10. The delay may be due to propagation delay and threshold voltage mismatches between both comparators 908, 912. For example, the maximum specified slope time (20% to 80%) can be 20 ns. The minimum specified voltage amplitude on the bus is 1.2V peak to peak. Thus, the maximum dV/dt is 36 mV/ns (1.2*(0.8−0.2)/20). The maximum specified voltage difference between comparators 2 and 3 is 0.55 V and this would result in a maximum delay of 16 ns (0.55/0.036). The mismatch in comparator delay is not specified in the CiA610-3, but the mismatch between rising and falling propagation delay is specified for comparator 2 and is between −7.5 ns and +7.5 ns. This is an indicator for a potential mismatch delay for comparator 2 and 3. A practical minimum value for TDISARM calculates to 31 ns (16+7.5+ 7.5) and is smaller compared to a bit time at 20 Mbit/s (50 ns). In some implementations, a practical value for the TDISARM timer 1004 would be around 100 ns which is fast enough to detect a recessive condition and long enough to prevent false recessive detection. This proposed filter time shall be interpreted as an example only and may vary depending on parameter changes in the CAN XL standard.

Figure 11:
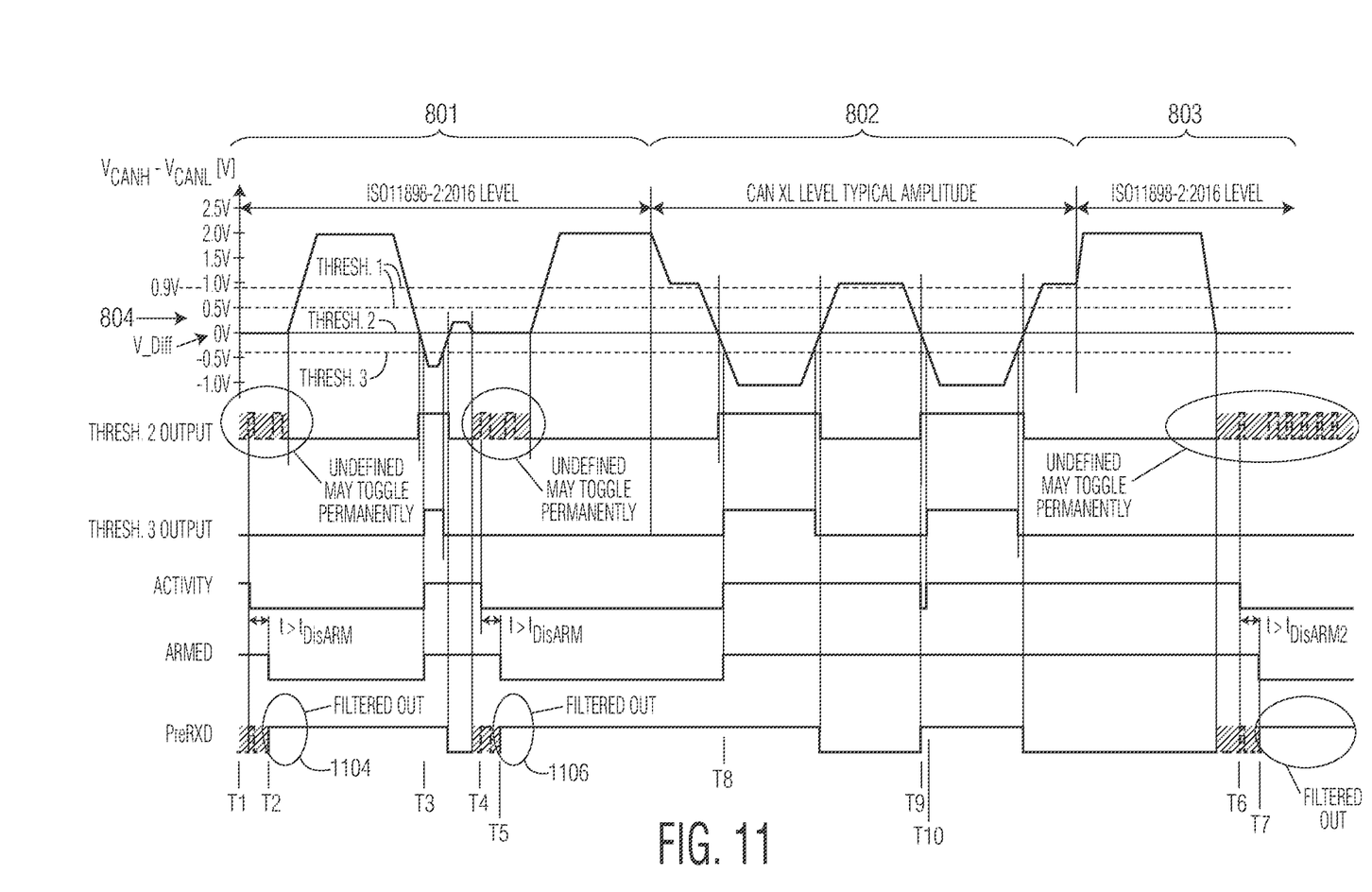
FIG. 11 shows a second example of a differential signal obtained from CAN bus signalling with the transceiver of FIG. 9 according to CAN FD which switches to CAN XL and back to CAN FD.

Referring to FIGS. 9, 10, and 11, FIG. 11 shows a third example of a differential signal obtained from CAN bus signalling for transceiver 900 (FIG. 9) according to CAN FD which switches to CAN XL and back to CAN FD. At time T1, the ACTIVITY signal is default active (HIGH) and immediately reset (LOW) through a rising edge of the threshold 2 comparator 912 since it is assumed the activity may be just noise. If the ACTIVITY signal stays LOW for time TDISARM, the ARMED signal goes low at time T2, confirming the presence of noise. The PreRXD signal is set to HIGH at time T2, which indicates there is no data on the bus.

When the bus signal passes threshold 3 at time T3, the transceiver 900 assumes the activity is not noise or cross talk. The ACTIVITY and ARMED signals are set HIGH in order to continue forwarding the Threshold 2 signal through OR gate 1006 and to multiplexer 914.

At time T4, the differential signal VDIFF is approximately 0V but could be subject to noise that is mistaken as data by receiving nodes, as indicated by the output of threshold 2 comparator 912. Once time TDISARM expires and the ACTIVITY signal stayed LOW for time TDISARM, the ARMED signal goes low, confirming the presence of noise. The PreRXD signal is set to HIGH at time T5, which indicates there is no data on the bus.

At time T6, the differential signal VDIFF is approximately 0V but again could be subject to noise that is mistaken as data by receiving nodes, as indicated by the output of threshold 2 comparator 912. Once time TDISARM expires and the ACTIVITY signal stayed LOW for time TDISARM, the ARMED signal goes low, confirming the presence of noise. The PreRXD signal is set to HIGH at time T7, which indicates there is no data on the bus.

FIG. 11 shows all pulses coming from threshold 2 comparator 912 that do not pass below threshold 3 are reliably filtered out of the PreRXD signal, as shown by circled portions 1104, 1106, 1108. The PreRXD signal stays HIGH for the time after such first pulse. With that, the CAN XL protocol controller of a receiving node in Data Level Mode would consistently receive a HIGH level on RXD pin 204 and conclude that the sender has stopped sending and the bus is on 0V differential. Note that in other implementations, the RXD pin 204 may show a permanent LOW level, which could also be interpreted as a sender that has stopped sending. In summary, once the signal on the RXD pin 204 stops toggling, the receiving nodes may conclude that the sender has stopped sending data over the bus instead of treating the noise as data signals.

Note that during time T8 through time T10 in FIG. 11, the voltage differential signal VDIFF falls below threshold 3, i.e., rising edge of the thresh 3 signal output by comparator 908 at time T8. The voltage differential signal subsequently falls below the first threshold 2 at time T9, followed by the voltage differential signal subsequently falling again below threshold 3 at time T10. Time T10 is within the predetermined amount of time (TDISARM) from the time T9. OOB logic 910 determines noise is not detected and does not filter the output of comparator 912. The armed signal remains HIGH and the output of comparator 912 is provided as the digital output signal to RXD pin 204.

Buy now it should be appreciated the, in selected embodiments, a controller Area Network (CAN) transceiver can comprise a receiver configured to determine a voltage differential signal (Vdiff) from analog signaling received from a CAN bus and configured to provide a digital output signal at a receiver output to a CAN controller based on the voltage differential signal, wherein the analog signaling received from the CAN bus is capable of operating in accordance with a first defined voltage level scheme of a first CAN protocol (e.g., CAN FD) and a second defined voltage level scheme for a second CAN protocol (e.g., CAN XL), the receiver can comprise a first comparator (912) configured to compare the voltage differential signal to a first threshold (thresh 2) which is set to a value which differentiates between a logic low bit and logic high bit in accordance with the second CAN protocol; and filtering circuitry (910) configured to selectively filter an output of the first comparator ("selectively filter" means can filter or not filter), based on detection of noise on the CAN bus, to provide a first digital signal (preRXD) indicative of activity on the CAN bus in accordance with the second CAN protocol.

In another aspect, the filtering circuitry can be configured to filter the output of the first comparator to provide the first digital signal when the analog signaling received from the CAN bus is operating in accordance with the first CAN protocol (e.g. during phases 801, 803).

In another aspect, when the filtering circuitry is filtering based on the detection of noise on the CAN bus, the first digital signal can be provided as a predetermined logic state (can either be a one or a zero), regardless of any toggling of the output of the first comparator.

In another aspect, when the filtering circuitry is not filtering based on not detecting noise on the CAN bus, the output of the first comparator can be provided as the first digital signal.

In another aspect, the receiver can further comprise a second comparator (908) configured to compare the voltage differential signal to a second threshold (thresh 3), wherein the second threshold is less than the first threshold, wherein the detection of noise is based on the output of the first comparator and an output of the second comparator.

In another aspect, the filtering circuitry can detect noise and filters the output of the first comparator to provide a predetermined logic state as the first digital signal in response to: the voltage differential signal falling below the second threshold (thresh 3, i.e. rising edge in thresh 3) at a first time (T3) followed by the voltage differential signal subsequently falling below the first threshold (thresh 2, i.e. next rising edge in thresh 2) at a second time (T4), without the voltage differential signal both rising above the second threshold and again falling below the second threshold (thresh 3) within a predetermined amount of time (tdisarm) from the second time (T4). (Example events which result in armed=0, hence filtering.)

In another aspect, the filtering circuitry can begin filtering by providing the predetermined logic state as the first digital signal at a third time (T5) corresponding to the predetermined amount of time from the second time (T4).

In another aspect, the filtering circuitry determines noise is not detected and does not filter the output of the first comparator, thus providing the output of the first comparator as the first digital signal, in response to: the voltage differential signal falling below the second threshold (thresh 3, i.e. rising edge in thresh 3) at the first time (T8), followed by the voltage differential signal subsequently falling below the first threshold (thresh 2) at the second time (T9), and followed by the voltage differential signal subsequently falling again below the second threshold (thresh 3) at a third time (T10), wherein the third time is within the predetermined amount of time from the second time. (example events which result in armed remaining at 1, hence no filtering).

In another aspect, the receiver can comprise a third comparator (906) configured to compare the voltage differential signal to a third threshold (thresh 1), in which the third threshold can be set to a value which differentiates between a logic low bit and logic high bit in accordance with the first CAN protocol, wherein the third threshold can be greater than the first threshold (thresh 2), and the first threshold can be greater than the second (thresh 3) threshold.

In another aspect, the receiver can be capable of operating in a first mode (fast mode) and a second mode (slow mode) in which when the receiver is operating in the first mode, the digital output signal at the receiver output can be generated from the first digital signal (input B of MUX 914 selected), and when the receiver is operating in the second mode, the digital output signal at the receiver output can be generated based on a second digital signal (input A of MUX 914 selected) based on outputs of the second and third comparators.

In another aspect, the value can also be a voltage value of a dominant or recessive bit in accordance with the first CAN protocol.

In other embodiments, a Controller Area Network (CAN) transceiver can comprise a receiver configured to determine a voltage differential signal (Vdiff) from analog signaling received from a CAN bus and configured to provide a digital output signal at a receiver output to a CAN controller based on the voltage differential signal, wherein the analog signaling received from the CAN bus can be capable of operating in accordance with a first defined voltage level scheme of a first CAN protocol (CAN FD) and a second defined voltage level scheme for a second CAN protocol (CAN XL). A first threshold (thresh 2) which can be set to a value which differentiates between a logic low bit and logic high bit in accordance with the second CAN protocol and a second threshold (thresh 3) can be set to a negative value, less than the first threshold. The receiver can be configured to provide a first digital signal at a predetermined logic state in response to the voltage differential signal falling below the second threshold (thresh 3, i.e. rising edge in thresh 3) at a first time (T3) followed by the voltage differential signal subsequently falling below the first threshold (thresh 2, i.e. next rising edge in thresh 2) at a second time (T4), without the voltage differential signal both rising above the second threshold and again falling below the second threshold (thresh 3) within a predetermined amount of time (tdisarm) from the second time (T4). (These events can result in armed being equal to 0, hence filtering.)

In another aspect, the receiver can be further configured to provide the first digital signal based on comparisons between the voltage differential signal and the first threshold in response to the voltage differential signal rising above the second threshold at a third time (e.g., vdiff can rise above thresh 2 anytime) and subsequently falling below the second threshold at a fourth time (e.g. a rising edge of thresh 3 causing armed to equal 1, e.g. T8), wherein the fourth time is subsequent to the predetermined amount of time from the second time. (These events can result in armed going back to 1, hence stops filtering.)

In another aspect, when the first digital signal can be provided based on comparisons between the voltage differential signal and the first threshold, the receiver can be configured to provide the first differential signal at a first logic state when the voltage differential signal can be greater than the first threshold, and a second logic state when the voltage differential signal can be less than the second threshold.

In another aspect, when the first digital signal is provided at the predetermined logic state, the first digital signal can be provided at the predetermined logic state regardless of any comparisons between the voltage differential signal and the first threshold.

In another aspect, a third threshold (thresh 1) can be set to a value which differentiates between a logic low bit and logic high bit in accordance with the first CAN protocol, wherein the third threshold can be greater than the first threshold (thresh 2).

In another aspect, the receiver can be capable of operating in a first mode (fast mode) and a second mode (slow mode) in which when the receiver is operating in the first mode, the digital output signal at the receiver output is generated from the first digital signal, and when the receiver is operating in the second mode, the digital output signal at the receiver output is generated based on a second digital signal (input to A) generated based on comparison of the voltage differential signal with each of the third threshold and the second threshold.

In further embodiments, a method can be performed in a Controller Area Network (CAN) transceiver. The transceiver can include a receiver configured to determine a voltage differential signal (Vdiff) from analog signaling received from a CAN bus and configured to provide a digital output signal at a receiver output to a CAN controller based on the voltage differential signal, wherein the CAN bus can be capable of operating in accordance with a first defined voltage level scheme of a first CAN protocol (CAN FD) and a second defined voltage level scheme for a second CAN protocol (CAN XL). The method can comprise, in response to detecting that the voltage differential signal has fallen below a first threshold (thresh 3, i.e. rising edge in thresh 3) at a first time (T3 or T8), determining if either noise or traffic is present on the CAN bus. When traffic is determined to be present on the CAN bus, providing a first digital signal based on comparisons between the voltage differential signal and a first threshold, wherein the first threshold can be set to a value which differentiates between a logic low bit and a logic high bit in accordance with the second CAN protocol. When noise is determined to be present on the CAN bus, the first digital signal can be provided at a constant predetermined logic state, regardless of the value of the voltage differential signal with respect to the first threshold.

In another aspect, determining noise to be present on the CAN bus (e.g., first time equals T3 in FIG. 11) can comprise determining that the voltage differential signal has fallen below a second threshold (thresh 2, i.e. next rising edge in thresh 2, activity equal to 0) at a second time (T4) subsequent to the first time (T3), without the voltage differential signal both rising above the first threshold and again falling below the first threshold (thresh 3) within a predetermined amount of time (tdisarm) from the second time (T4). (These events can result in armed=0, such as after activity going high at T3, hence filtering because noise is confirmed by these events.)

In another aspect, detecting traffic to be present on the CAN bus (first time equal to T8) can comprise determining that the voltage differential signal has fallen below the second threshold (thresh 2, i.e. next rising edge in thresh 2) at the second time (T9), in which the voltage differential signal rose above the first threshold after the first time but subsequently fell again below the first threshold (thresh 3) at a third time (T10), wherein the third time can be within the predetermined amount of time from the second time. (These events can result in armed being set to 1, such as after activity going high at T8, hence no filtering because traffic is confirmed by these events rather than noise.)

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A Controller Area Network (CAN) transceiver comprising:
 a receiver configured to determine a voltage differential signal from analog signaling received from a CAN bus and configured to provide a digital output signal at a receiver output to a CAN controller based on the voltage differential signal, wherein the analog signaling received from the CAN bus is capable of operating in accordance with a first defined voltage level scheme of a first CAN protocol and a second defined voltage level scheme for a second CAN protocol, the receiver comprising:
  a first comparator configured to compare the voltage differential signal to a first threshold which is set to a value which differentiates between a logic low bit and logic high bit in accordance with the second CAN protocol; and
  filtering circuitry configured to selectively filter an output of the first comparator, based on detection of noise on the CAN bus, to provide a first digital signal indicative of activity on the CAN bus in accordance with the second CAN protocol.

2. The CAN transceiver of claim 1, wherein the filtering circuitry is configured to filter the output of the first comparator to provide the first digital signal when the analog signaling received from the CAN bus is operating in accordance with the first CAN protocol.

3. The CAN transceiver of claim 1, wherein when the filtering circuitry is filtering based on the detection of noise on the CAN bus, the first digital signal is provided as a predetermined logic state, regardless of any toggling of the output of the first comparator.

4. The CAN transceiver of claim 3, wherein when the filtering circuitry is not filtering based on not detecting noise on the CAN bus, the output of the first comparator is provided as the first digital signal.

5. The CAN transceiver of claim 1, wherein the receiver further comprises a second comparator configured to compare the voltage differential signal to a second threshold, wherein the second threshold is less than the first threshold, wherein the detection of noise is based on the output of the first comparator and an output of the second comparator.

6. The CAN transceiver of claim 5, wherein the filtering circuitry detects noise and filters the output of the first comparator to provide a predetermined logic state as the first digital signal in response to:
 the voltage differential signal falling below the second threshold at a first time followed by the voltage differential signal subsequently falling below the first threshold at a second time, without the voltage differential signal both rising above the second threshold and again falling below the second threshold within a predetermined amount of time from the second time.

7. The CAN transceiver of claim 6, wherein the filtering circuitry begins filtering by providing the predetermined logic state as the first digital signal at a third time corresponding to the predetermined amount of time from the second time.

8. The CAN transceiver of claim 5, wherein the filtering circuitry determines noise is not detected and does not filter the output of the first comparator, thus providing the output of the first comparator as the first digital signal, in response to:
 the voltage differential signal falling below the second threshold at the first time, followed by the voltage differential signal subsequently falling below the first threshold at the second time, and followed by the voltage differential signal subsequently falling again below the second threshold at a third time, wherein the third time is within the predetermined amount of time from the second time.

9. The CAN receiver of claim 5, wherein the receiver comprises a third comparator configured to compare the voltage differential signal to a third threshold, in which the third threshold is set to a value which differentiates between a logic low bit and logic high bit in accordance with the first CAN protocol, wherein the third threshold is greater than the first threshold, and the first threshold is greater than the second threshold.

10. The CAN transceiver of claim 9, wherein the receiver is capable of operating in a first mode and a second mode in which when the receiver is operating in the first mode, the digital output signal at the receiver output is generated from the first digital signal, and when the receiver is operating in the second mode, the digital output signal at the receiver output is generated based on a second digital signal based on outputs of the second and third comparators.

11. The CAN transceiver of claim 1, wherein the value is also a voltage value of a dominant or recessive bit in accordance with the first CAN protocol.

12. A Controller Area Network (CAN) transceiver comprising:
a receiver configured to determine a voltage differential signal from analog signaling received from a CAN bus and configured to provide a digital output signal at a receiver output to a CAN controller based on the voltage differential signal, wherein the analog signaling received from the CAN bus is capable of operating in accordance with a first defined voltage level scheme of a first CAN protocol and a second defined voltage level scheme for a second CAN protocol, wherein a first threshold which is set to a value which differentiates between a logic low bit and logic high bit in accordance with the second CAN protocol and a second threshold is set to a negative value, less than the first threshold, the receiver configured to:
provide a first digital signal at a predetermined logic state in response to the voltage differential signal falling below the second threshold at a first time followed by the voltage differential signal subsequently falling below the first threshold at a second time, without the voltage differential signal both rising above the second threshold and again falling below the second threshold within a predetermined amount of time from the second time.

13. The CAN transceiver of claim 12, wherein the receiver is further configured to:
provide the first digital signal based on comparisons between the voltage differential signal and the first threshold in response to:
the voltage differential signal rising above the second threshold at a third time and subsequently falling below the second threshold at a fourth time, wherein the fourth time is subsequent to the predetermined amount of time from the second time.

14. The CAN transceiver of claim 13, wherein when the first digital signal is provided based on comparisons between the voltage differential signal and the first threshold, the receiver is configured to provide the first differential signal at a first logic state when the voltage differential signal is greater than the first threshold, and a second logic state when the voltage differential signal is less than the second threshold.

15. The CAN transceiver of claim 14, wherein when the first digital signal is provided at the predetermined logic state, the first digital signal is provided at the predetermined logic state regardless of any comparisons between the voltage differential signal and the first threshold.

16. The CAN transceiver of claim 12, wherein a third threshold is set to a value which differentiates between a logic low bit and logic high bit in accordance with the first CAN protocol, wherein the third threshold is greater than the first threshold.

17. The CAN transceiver of claim 16, wherein the receiver is capable of operating in a first mode and a second mode in which when the receiver is operating in the first mode, the digital output signal at the receiver output is generated from the first digital signal, and when the receiver is operating in the second mode, the digital output signal at the receiver output is generated based on a second digital signal generated based on comparison of the voltage differential signal with each of the third threshold and the second threshold.

18. In a Controller Area Network (CAN) transceiver having a receiver configured to determine a voltage differential signal from analog signaling received from a CAN bus and configured to provide a digital output signal at a receiver output to a CAN controller based on the voltage differential signal, wherein the CAN bus is capable of operating in accordance with a first defined voltage level scheme of a first CAN protocol and a second defined voltage level scheme for a second CAN protocol, a method comprising:
in response to detecting that the voltage differential signal has fallen below a first threshold at a first time, determining if either noise or traffic is present on the CAN bus;
when traffic is determined to be present on the CAN bus, providing a first digital signal based on comparisons between the voltage differential signal and a first threshold, wherein the first threshold is set to a value which differentiates between a logic low bit and a logic high bit in accordance with the second CAN protocol;
when noise is determined to be present on the CAN bus, providing the first digital signal at a constant predetermined logic state, regardless of the value of the voltage differential signal with respect to the first threshold.

19. The method of claim 18, wherein the determining noise to be present on the CAN bus comprises:
determining that the voltage differential signal has fallen below a second threshold at a second time subsequent to the first time, without the voltage differential signal both rising above the first threshold and again falling below the first threshold within a predetermined amount of time from the second time.

20. The method of claim 19, wherein detecting traffic to be present on the CAN bus comprises:
determining that the voltage differential signal has fallen below the second threshold at the second time, in which the voltage differential signal rose above the first threshold after the first time but subsequently fell again below the first threshold at a third time, wherein the third time is within the predetermined amount of time from the second time.

* * * * *